United States Patent
Chen et al.

(10) Patent No.: US 6,348,276 B1
(45) Date of Patent: *Feb. 19, 2002

(54) MAGNETIC RECORDING MEDIA WITH A SURFACE-OXIDIZED NIAL SUB-SEEDLAYER

(75) Inventors: Qixu Chen; Zhong Wu, both of Fremont; Samuel Dacke Harkness, IV, Sunnyvale; Charles Leu, Fremont; Rajiv Yadav Ranjan, San Jose, all of CA (US)

(73) Assignee: Seagate Technology LLC, Scotts Valley, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/382,581

(22) Filed: Aug. 25, 1999

Related U.S. Application Data

(60) Provisional application No. 60/101,762, filed on Sep. 25, 1998, and provisional application No. 60/101,839, filed on Sep. 25, 1998.

(51) Int. Cl.[7] .............................. G11B 5/66; G11B 5/70; C23C 14/00; C23C 14/34; B05D 5/12

(52) U.S. Cl. .............................. 428/694 TS; 204/192.1; 204/192.15; 204/192.2; 427/129; 427/131

(58) Field of Search ........................... 428/65.3, 694 T, 428/694 TS, 900; 204/192.1, 192.11, 192.15, 192.2; 427/533, 126.2, 129, 131

(56) References Cited

U.S. PATENT DOCUMENTS

| | | | |
|---|---|---|---|
| 5,153,044 A | 10/1992 | Chen et al. | 428/64 |
| 5,302,434 A | 4/1994 | Doerner et al. | 428/64 |
| 5,587,235 A | 12/1996 | Suzuki et al. | 428/332 |
| 5,693,426 A | 12/1997 | Lee et al. | 428/611 |
| 5,700,593 A | 12/1997 | Okumura et al. | 428/694 TS |
| 5,800,931 A | 9/1998 | Lee et al. | 428/611 |
| 5,851,688 A | 12/1998 | Chen et al. | 428/694 T |
| 5,858,566 A | 1/1999 | Zhang | 428/694 TS |
| 5,866,227 A | 2/1999 | Chen et al. | 428/65.3 |
| 6,007,924 A | * 12/1999 | Lal et al. | 428/611 |
| 6,110,582 A | * 8/2000 | Wu et al. | 428/332 |
| 6,117,570 A | * 9/2000 | Chen et al. | 428/694 T |
| 6,139,951 A | * 10/2000 | Chen et al. | 428/332 |

OTHER PUBLICATIONS

"NiAl Underlayers for CoCrTa Magnetic Thin Films" by Lee et al., IEEE Transactions on Magnetics, vol. 30, No. 6, Nov. 1994, pp. 3951–3953.

"The Role fo NiAl Underlayers in Longitudinal Recording Media (Abstract)" by Ross et al., Journal of Applied Physics: Proceedings of the 41st Annual Conference on Magnetism and Magnetic Materials, vol, 81, No. 8, Apr. 15, 1997, Part 2A, p. 4369.

* cited by examiner

Primary Examiner—Vivian Chen
Assistant Examiner—Holly C. Rickman
(74) Attorney, Agent, or Firm—McDermott, Will & Emery

(57) ABSTRACT

Magnetic recording media with high coercivity and low noise, suitable for high density longitudinal recording, are formed with a surface oxidized sub-seedlayer between a non-magnetic substrate and seedlayer. Embodiments include depositing a NiAl sub-seedlayer on a glass or glass-ceramic substrate, oxidizing the surface of the NiAl sub-seedlayer, and then sequentially depositing a NiAl seedlayer, Cr or Cr alloy underlayer, e.g., CrMo, an optional intermediate CoCrTa alloy layer, a magnetic layer, e.g., a Co-alloy magnetic layer, and a protective overcoat, e.g., a carbon-containing protective overcoat.

19 Claims, 6 Drawing Sheets

MAGNETIC RECORDING MEDIA WITH A SURFACE-OXIDIZED NIAL SUB-SEEDLAYER

RELATED APPLICATIONS

This application claims priority from Provisional Application Ser. No. 60/101,762 filed on Sep. 25, 1998 entitled: "MEDIA WITH SURFACE-OXIDIZED SUB-SEEDLAYERS", the entire disclosure of which is hereby incorporated by reference herein.

This application also claims priority from Provisional Application Ser. No. 60/101,839 filed on Sep. 25, 1998 entitled: "IN-LINE PROCESS OF MAKING MEDIA HAVING SURFACE-OXIDIZED SUB-SEEDLAYERS", the entire disclosure of which is hereby incorporated by reference herein.

This application contains the subject matter similar to subject matter disclosed in copending U.S. patent application Ser. No. 09/379,505 filed on Aug. 23, 1999

TECHNICAL FIELD

The present invention relates to magnetic recording media, such as thin film magnetic recording disks, and to a method of manufacturing the media. The present invention has particular applicable to high areal density longitudinal magnetic recording media exhibiting low noise and enhanced magnetic performance. cl BACKGROUND ART Magnetic recording media are extensively employed in the computer industry and can be locally magnetized by a write transducer or write head to record and store information. The write transducer creates a highly concentrated magnetic field which alternates direction based upon bits of the information being stored. When the local magnetic field produced by the write transducer is greater than the coercivity of the recording medium, grains of the recording medium at that location are magnetized. The grains retain their magnetization after the magnetic field produced by the write transducer is removed. The direction of the magnetization matches the direction of the applied magnetic field. The magnetization of the recording medium can subsequently produce an electrical response to a read sensor, allowing the stored information to be read.

There is an ever increasing demand for magnetic recording media with higher storage capacity, lower noise and lower costs. Efforts, therefore, have been made to reduce the size required to magnetically record bits of information, while maintaining the integrity of the information as size is decreased. The space necessary to record information in magnetic recording media depends upon the size of transitions between oppositely magnetized areas. It is, therefore, desirable to produce magnetic recording media that will support the smallest transition size possible. However, the signal output from the transition must avoid excessive noise to reliably maintain the integrity of the stored information. Media noise is generally characterized as the sharpness of a signal on readback against the sharpness of a signal on writing and is generally expressed in signal-to-media noise ratio (SMNR).

The increasing demands for higher areal recording density impose increasingly greater demands on thin film magnetic recording media in terms of remanent coercivity (Hr), magnetic remanance (Mr), coercivity squareness (S*), SMNR, and narrow track recording performance. It is extremely difficult to produce a magnetic recording medium satisfying such demanding requirements.

The linear recording density can be increased by increasing the Hr of the magnetic recording medium, and can be accomplished by decreasing the medium noise, as by maintaining very fine magnetically non-coupled grains. Medium noise in thin films is a dominant factor restricting increased recording density of high density magnetic hard disk drives, and is attributed primarily to inhomogeneous and large grain size and intergranular exchange coupling. Accordingly, in order to increase linear density, medium noise must be minimized by suitable microstructure control.

Longitudinal magnetic recording media containing cobalt (Co) or a Co-based alloy magnetic films with a chromium (Cr) or Cr alloy underlayer deposited on a non-magnetic substrate have become the industry standard. For thin film longitudinal magnetic recording media, the desired crystallized structure of the Co and Co alloys is hexagonal close packed (HCP) with uniaxial crystalline anisotropy and a magnetization easy direction along the c-axis is in the plane of the film. The better the in-plane c-axis crystallographic texture, the more suitable is the Co alloy thin film for use in longitudinal recording to achieve high remanance. For very small grain sizes coercivity increases with increased grain size. The large grains, however, result in greater noise. Accordingly, there is a need to achieve high coercivities without the increase in noise associated with large grains. In order to achieve low noise magnetic recording media, the Co alloy thin film should have uniform small grains with grain boundaries capable of magnetically isolating neighboring grains. This type of microstructural and crystallographic control is typically attempted by manipulating the deposition process, grooving the substrate surface and proper use of an underlayer.

Underlayers can strongly influence the crystallographic orientation, the grain size and chemical segregation of the Co alloy grain boundaries. Conventional underlayers include Cr and alloys of Cr with elements such as titanium (Ti), tungsten (W), molybdenum (Mo) and vanadium (V).

There are other basic characteristics of magnetic recording media, aside from SMNR, which are indicative of recording performance, such as half-amplitude pulse width (PW50), overwrite (OW), and modulation level. At high linear recording density, adjacent bits are crowded together. A wide PW50 results in interference which limits the linear packing density of bits in a even track and, hence, reduces packing density in a given area thereby eliminating the recording capacity of the magnetic recording medium. Accordingly, a narrow PW50 is desirable for high areal recording density.

OW is a measure of the ability of the magnetic recording medium to accommodate overwriting of existing data. In other words, OW is a measure of what remains of a first signal after a second signal, e.g., at a different frequency, has been written over it on the medium. OW is considered low or poor when a significant amount of the first signal remains.

It is extremely difficult to obtain optimum performance from a magnetic recording medium by optimizing each of the PW50, OW, SMNR and modulation level, as these performance criteria are interrelated and tend to be offsetting. For example, if coercivity is increased to obtain a narrower PW50, OW is typically adversely impacted, as increasing coercivity typically degrades OW. A thinner medium having a lower Mr x thickness (Mrt) yields a narrower PW50 and better OW; however, the medium signal is typically reduced. Increasing the squareness of the hysteresis loop contributes to a narrower PW50, and better OW; however, noise may increase due to intergranular exchange coupling and magnetostatic interaction. Thus, a formidable challenge is present in optimizing magnetic performance in terms of PW50,, OW, SMNR and modulation level.

It is recognized that the magnetic properties, such as Hr, Mr, S* and SMNR, which are critical to the performance of a magnetic alloy film, depend primarily upon the microstructure of the magnetic layer which, in turn, is influenced by the underlying layers, such as the underlayer. It is also recognized that underlayers having a fine grain structure are highly desirable, particular for growing fine grains of HCP Co alloys deposited thereon.

It has been reported that nickel-aluminum (NiAl) films exhibit a grain size which is smaller than similarly deposited Cr films, which are the underlayer of choice in conventional magnetic recording media. Li-Lien Lee et al., "NiAl Underlayers for CoCrTa Magnetic Thin Films", IEEE Transactions on Magnetics, Vol. 30, No. 6, pp. 3951–3953, 1994. Accordingly, NiAl thin films are potential candidates as underlayers for magnetic recording media for high density longitudinal magnetic recording. However, it was found that the coercivity of a magnetic recording medium comprising an NiAl underlayer is too low for high density recording, e.g. about 2,000 Oersteds (Oe). The use of an NiAl underlayer is also disclosed by C.A. Ross et al., "The Role of An NiAl Underlayers In Longitudinal Thin Film Media", J. Appl. Phys. 81(8), P.4369, 1997. NiAl underlayers are also disclosed by Lee et al. in U.S. Pat. No. 5,693,426 and Lee et al. in U.S. Pat. No. 5,800,931. A magnetic recording medium comprising a NiAl seedlayer under a Cr underlayer is disclosed by Zhang in U.S. Pat. No. 5, 858,566.

In copending U.S. patent application Ser. No. 09/152,326 filed on Sep. 14, 1998 now U.S. Pat. No. 6,117,570 issued Sep. 12, 2000 a magnetic recording medium is disclosed comprising a NiAl seedlayer having an oxidized surface, a chromium underlayer on the seedlayer, and a magnetic layer on the underlayer. Chen et al. in U.S. Pat. No. 5,153,044 disclose magnetic recording medium comprising a non-magnetic substrate, a plated nickel-phosphorous layer thereon, and a sputtered underlayer comprising a nickel phosphorous layer formed on the plated nickel phosphorous layer. It is further disclosed that the sputtering target can comprise aluminum. Ranjan et al. in U.S. Pat. No. 5,642,094 disclose a magnetic recording medium comprising a plated nickel phosphorous layer on a substrate and an amorphous sputtered nucleation layer of nickel phosphorous deposited on the plated nickel phosphorous layer. The sputtered nucleation layer can comprise alumina. Chen et al. in U.S. Pat. No. 5,851,688 disclose a magnetic recording medium comprising a nickel phosphorous underlayer and a nickel phosphorous nucleation layer sputtered thereon. The nucleation layer can comprise an oxide dopant, such as alumina.

Okumura et al. in U.S. Pat. No. 5,700,593 disclose a magnetic recording medium comprising a substrate and a seedlayer comprising an oxygen-containing non-magnetic amorphous metal or a seedlayer comprising a non-magnetic amorphous metal having an oxygen-containing layer thereon, and an underlying non-magnetic layer laminated on the seedlayer. Doerner et al. in U.S. Pat. No. 5,302,434 disclose a magnetic recording medium comprising an untextured nickel phosphorous coating on a disk substrate which is oxidized to form a nickel oxide film. Suzuki et al. in U.S. Pat. No. 5,587,235 disclose a magnetic recording medium comprising a multi-layer structure containing at least one paramagnetic intermediate region or oxygen-rich region disposed between magnetic layers. Chen et al. in U.S. Pat. No. 5,866,227 disclose a magnetic recording medium comprising a glass or glass-ceramic substrate formed by sequentially depositing thereon a partially oxidized nickel phosphorous seedlayer, an underlayer and a magnetic layer.

There exist a need for high areal density longitudinal magnetic recording media exhibiting high Hr and high SMNR, and methodology for manufacturing such magnetic recording media. There also exist a need for magnetic recording media containing a glass or glass-ceramic substrate exhibiting high Hr and high SMNR.

DISCLOSURE OF THE INVENTION

An advantage of the present invention is a magnetic recording medium for high areal recording density exhibiting low noise and high Hr.

Another advantage of the present invention is a method of manufacturing a magnetic recording medium suitable for high areal recording density and exhibiting low noise and high Hr.

Additional advantages and features of the present invention will be set forth in part in the description which follows and in part will become apparent to those having ordinary skill in the art upon examination of the following only to be learned from the practice of the present invention. The advantages of the present invention may be realized and obtained and particularly pointed out in the appended claims.

According to the present invention, the foregoing and other advantages are achieved by a magnetic recording medium comprising a non-magnetic substrate; a nickel aluminum (NiAl) sub-seedlayer having an oxidized surface on the non-magnetic substrate; a NiAl seedlayer on the surface oxidized NiAl sub-seedlayer; an underlayer on the NiAl seedlayer; and a magnetic layer on the underlayer.

Another aspect of the present invention is a method of manufacturing a magnetic recording medium, the method comprising depositing a nickel aluminum (NiAl) sub-seedlayer on a non-magnetic substrate; oxidizing the surface of the NiAl sub-seedlayer; depositing a NiAl seedlayer on the surface oxidized NiAl sub-seedlayer; and depositing a magnetic layer on the seedlayer.

Embodiments of the present invention comprise sputter depositing a NiAl sub-seedlayer on a glass or glass-ceramic substrate, surface oxidizing the NiAl seedlayer in an oxidizing atmosphere containing about 1 to about 100 vol. % oxygen, e.g., about 20 vol. % oxygen with an inert gas, such as argon, sputter depositing an NiAl seedlayer on the oxidized surface of the NiAl sub-seedlayer, depositing a Cr alloy underlayer, such as CrMo, on the NiAl seedlayer, optionally depositing a flash cobalt- chromium-tantalum (CoCrTa) on the underlayer and depositing a cobalt-chromium magnetic alloy layer on the flash CoCrTa layer. Embodiments include forming the sub-seedlayer at a thickness of about 50 Å to about 1,000 Å e.g., about 100 Å to about 500 Å.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its details are capable of modifications in various obvious respects, all without departing from the present invention. Accordingly,, the drawings and description are to be regarded as illustrative in nature and not as restrictive.

Figure 1:
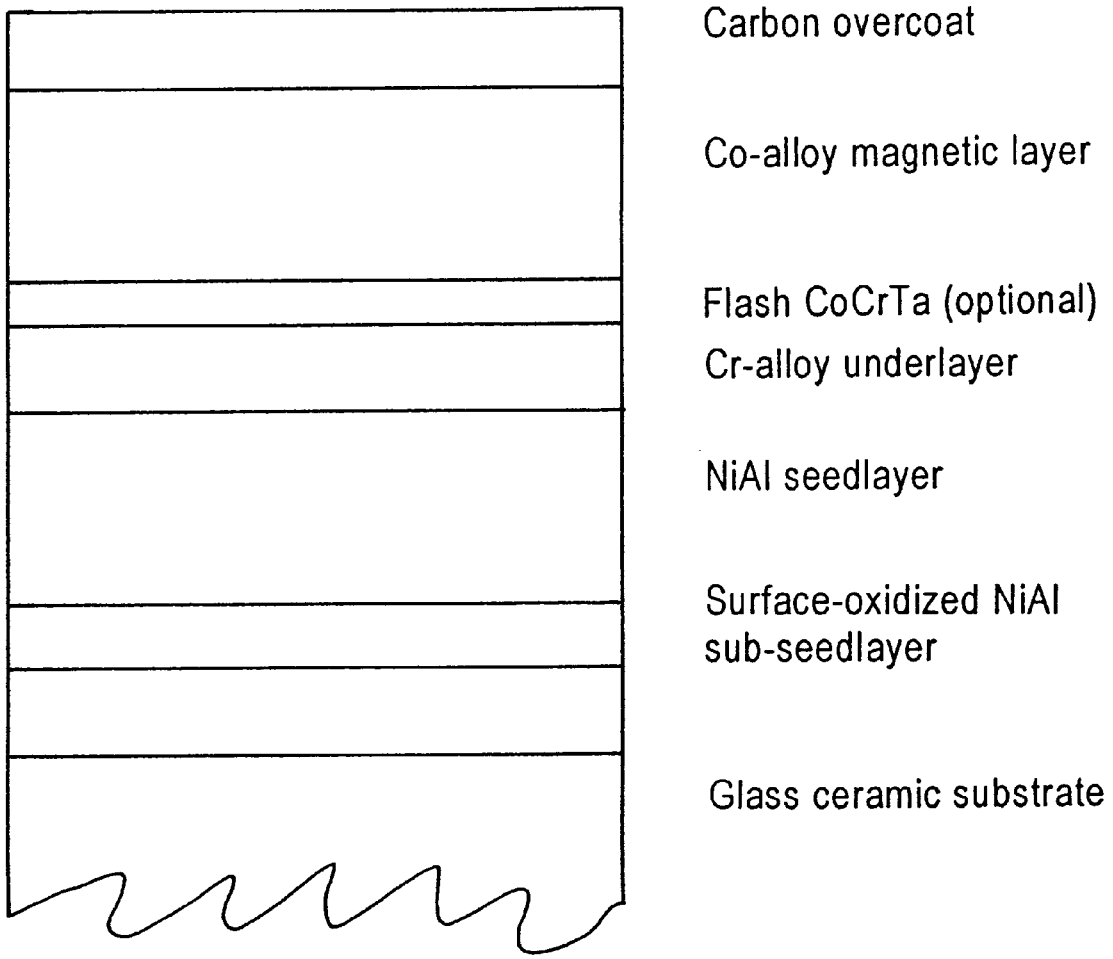
FIG. 1 schematically illustrates a magnetic recording medium in accordance with an embodiment of the present invention.

DESCRIPTION OF THE INVENTION:

The present invention provides magnetic media suitable for use in high areal recording density longitudinal magnetic recording media exhibiting high Hr and high SMNR. The present invention achieves such technological advantages by strategically reducing the size of the grains of the underlayer and magnetic layer while increasing the uniformity of the grains of the underlayer and magnetic layer.

Rigid magnetic recording media having underlayers and magnetic layers exhibiting small and uniform grains are desirable in order to minimize medium noise. NiAl seedlayers can be formed with small uniform grains. The subsequently deposited underlayer and magnetic layer can benefit from the small uniform grains of the NiAl seedlayer by epitaxial growth. The present invention satisfies the increasing demand for higher areal recording density by providing magnetic recording media exhibiting high coercivity and low noise utilizing NiAl seedlayers by efficient methodology.

In accordance with embodiments of the present invention, an NiAl sub-seedlayer is deposited on a substrate, such as a glass or glass ceramic substrate. The surface of the sub-seedlayer is oxidized, thereby providing a suitable surface for the nucleation and growth of the subsequently deposited NiAl seedlayer which, in turn, enables the subsequently deposited underlayer and magnetic layer to exhibit smaller uniform grains via epitaxial growth.

The exact mechanism by which the surface oxidation of the NiAl sub-seedlayer achieves superior recording performance, e.g., high SMNR and high Hr, is not known with certainty. It is believed, however, that surface oxidized NiAl sub-seedlayer, particularly on a glass or glass ceramic substrate, enhances the uniformity of the surface for nucleation and growth of the NiAl seedlayer which, in turn, induces epitaxial growth of the subsequently deposited underlayer and magnetic layer thereon with extremely uniform, small and substantially magnetically uncoupled grains.

The NiAl sub-seedlayer and NiAl seedlayer in accordance with embodiments of the present invention can contain about 40 to about 55 at. % aluminum. The thickness of the various layers in accordance with embodiments of the present invention can be readily optimized in a particular situation given the guidance of the present disclosure and disclosed objectives. For example, the sub-seedlayer can be formed at a thickness of about 50 Å to about 1,000 Å, e.g., about 100 Å to about 500 Å. The NiAl seedlayer can be deposited at a thickness of about 100 Å to about 1,000 Å e.g., about 300 Å to about 600 Å. The underlayer, such as a Cr or Cr alloy underlayer, e.g., chromium-molybdenum (CrMo), can be sputter deposited at a thickness of about 20 Å to about 1,000 Å, e.g., about 25 Å to about 100 Å.

Embodiments of the present invention also include sputter depositing a thin flash layer of cobalt-chromium-tantalum (CoCrTa) on the underlayer. The flash CoCrTa layer can comprise about 10 to about 20 at. % Cr, about 1 to about 6 at. % Ta, the balance Co. The flash CoCrTa layer enhances coercivity. The magnetic layer deposited in accordance with the present invention can comprise any of various Co alloys, such as Co—Cr alloys, e.g., cobalt-chromium-platinum, cobalt-chromium-tantalum, cobalt-chromium-platinum-tantalum and cobalt-chromium-platinum-tantalum-niobium alloys.

A magnetic recording medium in accordance with the an embodiment of the present invention is schematically illustrated in FIG. 1 and comprises substrate 10, e.g., a glass-ceramic substrate, a surface oxidized NiAl sub-seedlayer 11, NiAl seedlayer 12 on the sub-seedlayer, a Cr alloy underlayer 13, e.g., CrMo, on NiAl seedlayer 12, an optional flash CoCrTa layer 14 on underlayer 13, a Co-alloy magnetic layer 15 on optional flash CoCrTa layer 14, and a protective overcoat 16, e.g., a carbon-containing protective overcoat. A conventional lubricant topcoat (not shown) is typically provided on protective overcoat 16. It should be understood that the layers 11–16 are sequentially deposited on both sides of substrate 10.

Embodiments of the present invention include sputter depositing a NiAl seedlayer on a glass or glass ceramic substrate and oxidizing the surface of the sputter deposited NiAl seedlayer at a suitable temperature, e.g., about 20° C. to about 300° C., in an oxidizing atmosphere.

Suitable oxidizing atmospheres can contain about 1 to about 100 vol. % of oxygen ($O_2$), the remainder an inert gas, such as argon (Ar), such as an atmosphere containing about 5 to about 25 vol. % $O_2$, e.g., about 20% by volume $O_2$. The surface of the NiAl sub-seedlayer can be oxidized at a pressure of about 0.1 mTorr to about 200 Torr, such as about 5 mTorr, for more than about 1 second, e.g., about 5 seconds. The degree of oxidation can be such that the amount of oxygen is about 10 at. % to about 80 at. %, e.g., about 20 at. % to about 25 at. % in a top 50 Å region after in situ sputter removal of a 40 Å surface layer. The surface oxidized NiAl sub-seed layer of the present invention can be represented by $NiAlO_x$. The oxidizing gas can also comprise $So_2$, $NO_2$, $N_2O$, No, Co, and/or $CO_2$.

Figure 8:
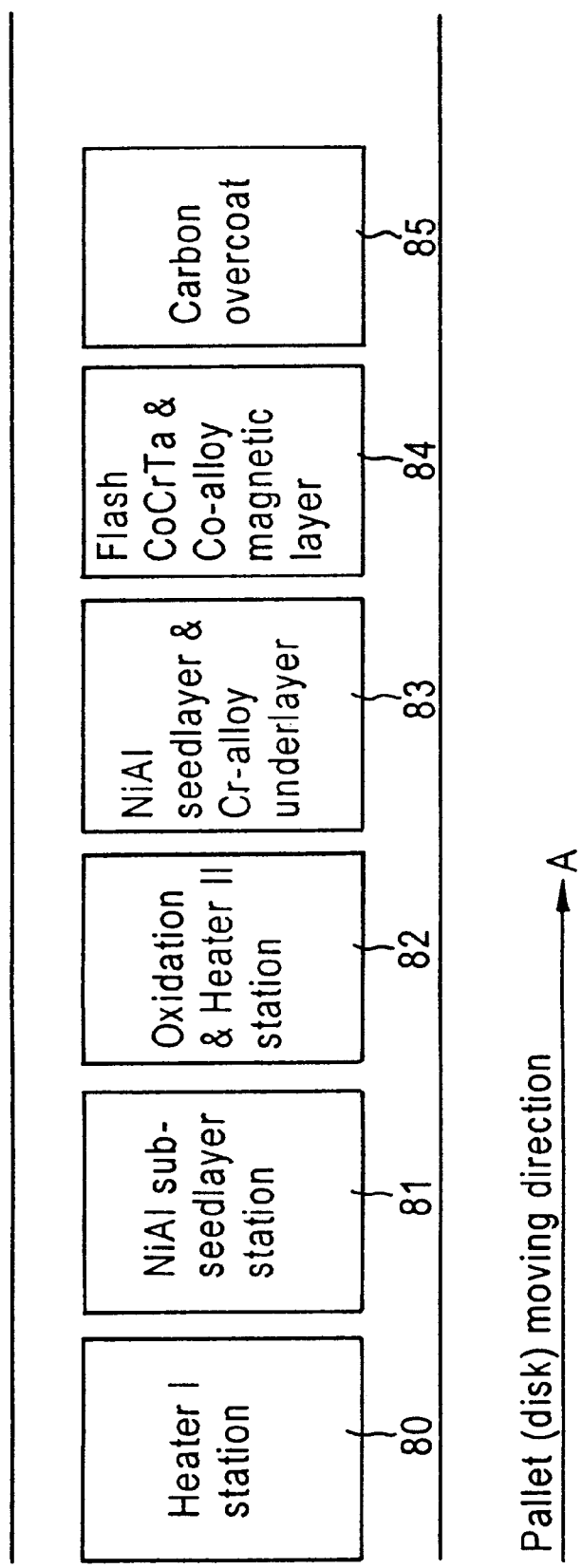
FIG. 8 schematically illustrates an in-line pass-by sputtering system for use in accordance with embodiments of the present invention.

Advantageously, magnetic recording medium in accordance with the present invention can be manufactured on an in-line pass-by sputtering system modified for use in accordance with the present invention. FIG. 8 schematically illustrates a suitable configuration of an in-line pass-by sputtering system for use in accordance with embodiments of the present invention. The disk substrates travel sequentially, in the direction of arrow A, from Heater I station 80 to NiAl sub-seedlayer deposition station 81 and then to oxidation and heater II station 82. Subsequent to oxidation and heating, the substrates are passed through the NiAl seedlayer and Cr alloy underlayer deposition station 83. The disks are then passed to flash CoCrTa and Co-alloy magnetic deposition station 84, wherein the optional CoCrTa flash layer is deposited at a thickness of about 1.5 to about 20 Å for enhanced coercivity. The disks are then passed to the protective carbon overcoat deposition station 85. The oxidation and Heater II stations can be combined in one station or separated into different stations; however, as the second heating should not be conducted before oxidation. Sputter deposition of the NiAl seedlayer, Cr-alloy underlayer, flash CoCrTa layer and Co-alloy magnetic layer can be conducted in four stations, respectively, or combined into less than four, e.g., two stations. Experimentation demonstrated that magnetic recording media manufactured in accordance with the present invention exhibit high coercivity and high SMNR, and are extremely suitable for high density longitudinal magnetic recording.

EXAMPLES

Figure 2:
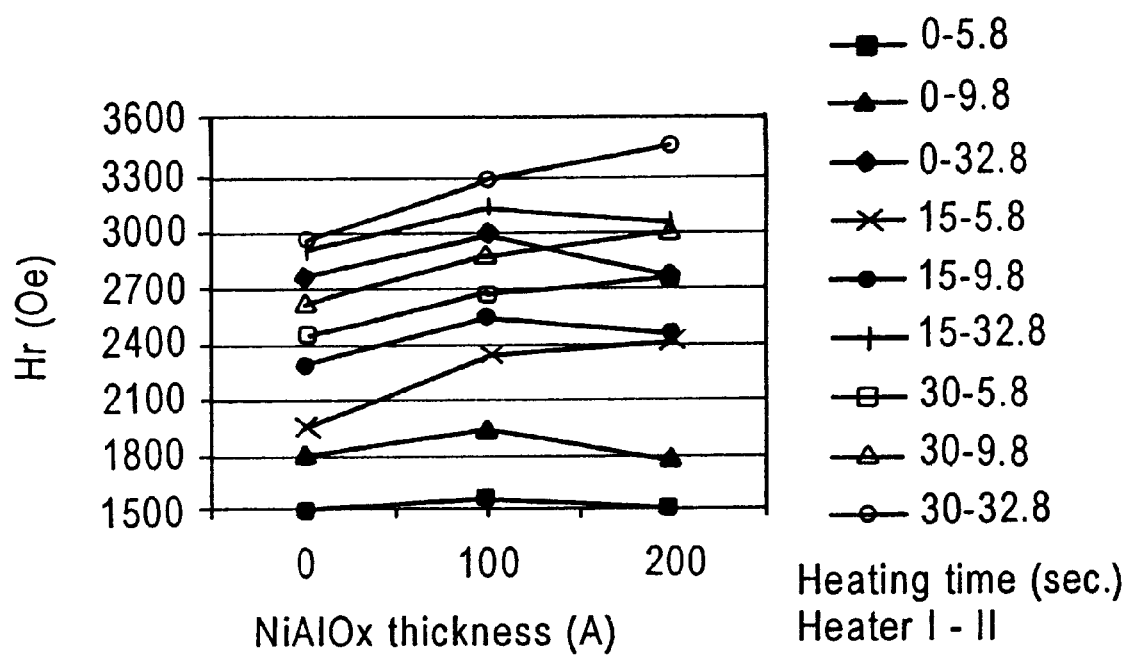
FIG. 2 illustrates the dependence of Hr on the thickness of the surface oxidized NiAl sub-seedlayer.

Magnetic recording media were prepared under identical conditions comprising identical layers except where otherwise indicated. FIG. 2 shows the Hr dependence on the thickness of the surface-oxidized NiAl sub-seedlayers ($NiAlO_x$) of glass/$NiAlO_x$/NiAl/CrMo/Co-alloy media. In manufacturing the media, two heater stations were located at both sides next to the $NiAlO_x$ sub-seedlayer deposition station in the sputtering system. Various heating times were employed as shown in FIG. 2. The Hr of the magnetic recording media in accordance with the present invention with a 100 Å sub-seedlayer, i.e., magnetic recording media with the inventive $NiAlO_x$ sub-seedlayer, is higher than that of NiAl/CrMo/Co-alloy magnetic recording media.

Figure 3:
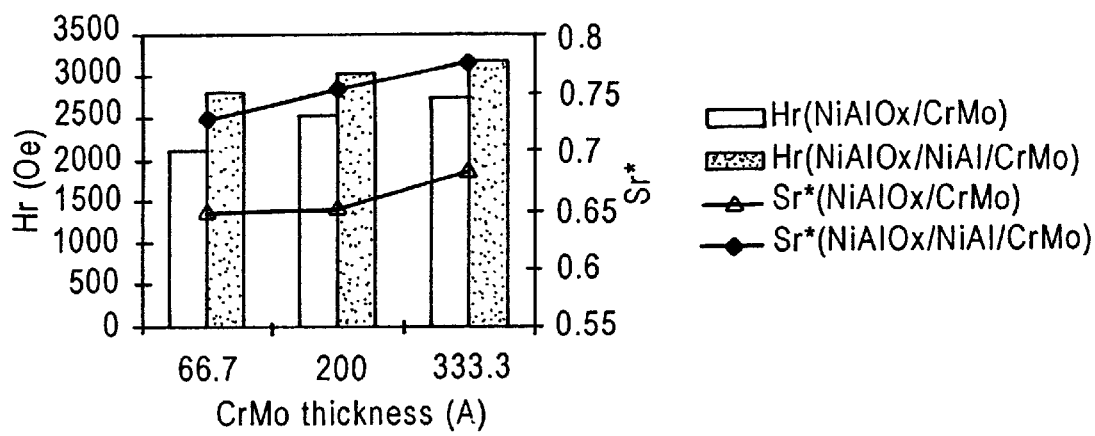
FIGS. 3 and 4 compare a magnetic recording medium in accordance with an embodiment of the present invention with a magnetic recording medium without a NiAl seedlayer.
Figure 4:
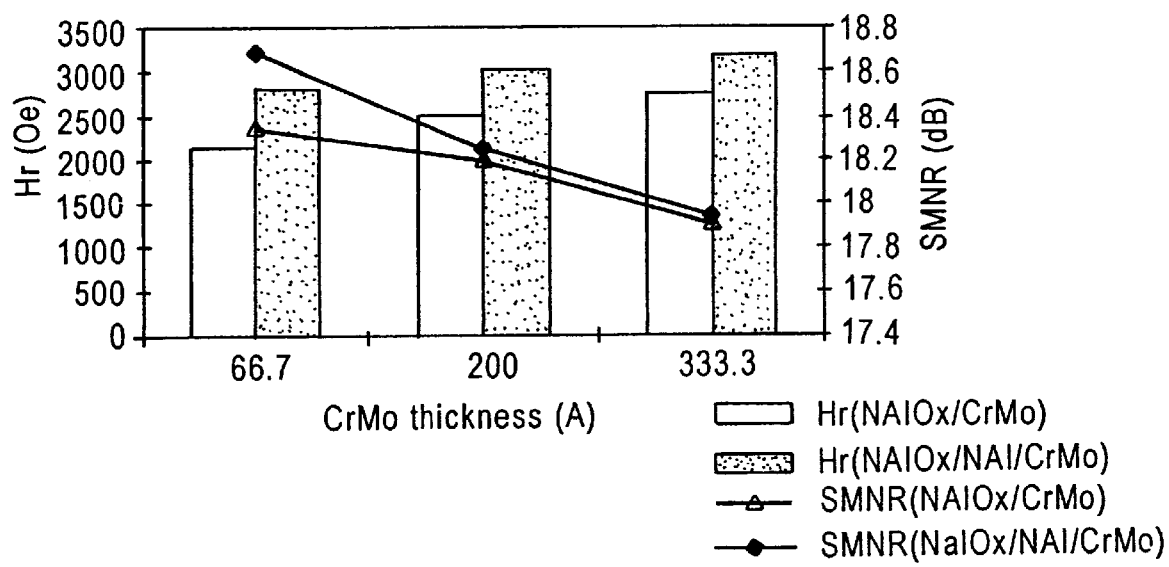
Figure 5:
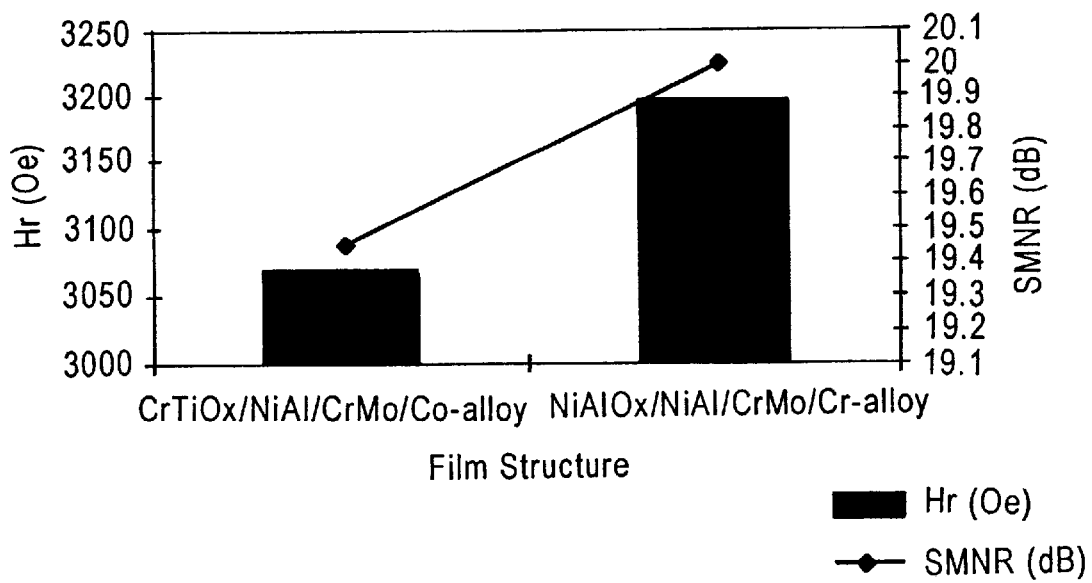
FIG. 5 compares a magnetic recording medium in accordance with an embodiment of the present invention with a magnetic recording medium having a different sub-seedlayer.

FIGS. 3 and 4 compare a $NiAlO_x$/CrMo/CoCrPtTa media with $NiAlO_x$/NiAl/CrMo/CoCrPtTa media. The only difference between each pair of the two kinds of media with identical CrMo thickness is the NiAl seedlayer. One group of media do not contain NiAl seedlayers; whereas, the other media in accordance with the present invention contain NiAl seedlayers on the $NiAlO_x$ sub-seedlayer. As shown in FIGS. 3 and 4, media in accordance with the present invention exhibit higher Hr as well as higher remanent coercivity squareness (Sr*) than that of the media without the NiAl seedlayer. If a thicker CrMo underlayer is applied to the media without the NiAl seedlayers in an attempt to increase Hr, the recording performances will suffer. This can be seen from Table I below. The media reported in Table I have similar Hr and Mrt. The media of $NiAlO_x$/CrMo/CoCrPtTaNb were deposited with thicker CrMo underlayers to have a similar Hr resulting in lower SMNR and high jitter.

TABLE I

| Seedlayer and underlayer | Hr | Mrt | Sr* | SMNR @ 270 KFCI | Jitter @ 270 KFCI |
|---|---|---|---|---|---|
| | Oe | memu/cm² | | dB | μ" |
| NiAlOx/CrMo | 2748.5 | 0.41 | 0.685 | 22.2 | 0.1595 |
| NiAlOx/NiAl/CrMo | 2805 | 0.415 | 0.73 | 22.75 | 0.1425 |

The inventive media exhibit higher Hr and SMNR than the media with a $CrTiO_x$ sub-seedlayer deposited under identical conditions. The seedlayer crystal structure depends on the morphology of the sub-seedlayer. The surface of the $NiAlO_x$ layer is suitable for the growth of the NiAl seedlayer.

Figure 6:
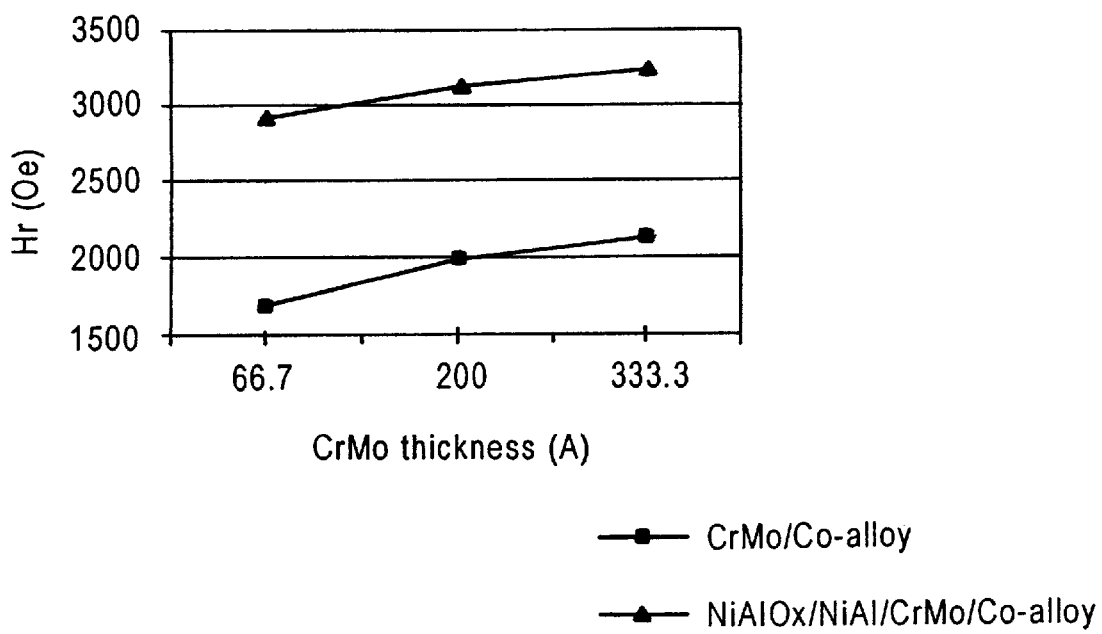
FIGS. 6 and 7 compare magnetic recording media in accordance with the present invention with conventional glass media having chromium vanadium and chromium-molybdenum underlayers.
Figure 7:
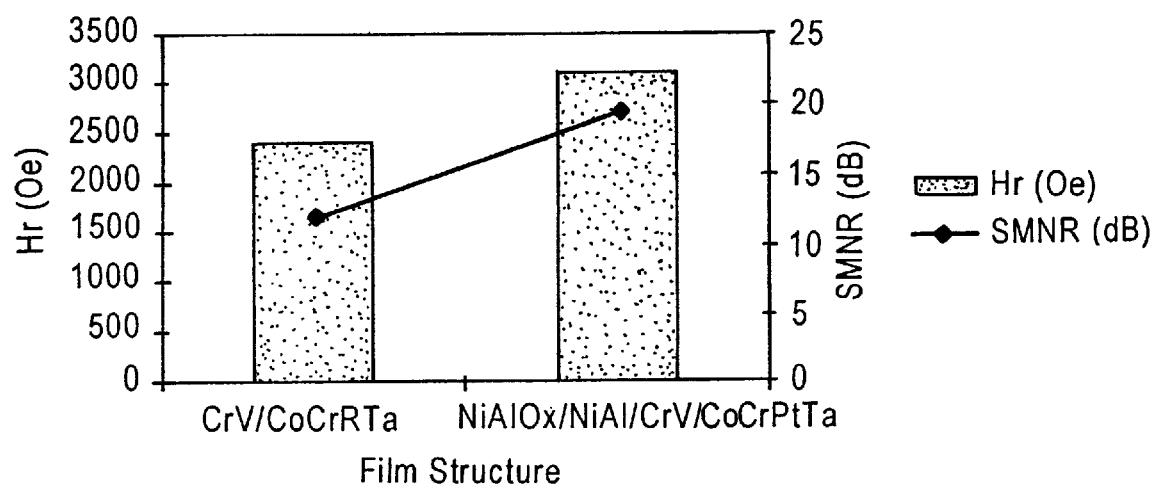

FIGS. 6 and 7 compare the inventive media with conventional glass media with CrV and CrMo underlayers. The media in accordance with the present invention exhibit a significantly higher Hr and SMNR than conventional media which do not contain any seedlayers and sub-seedlayers.

The experimental data demonstrate that the inventive media contain a proper sub-seedlayer to provide proper surface growth for an NiAl seedlayer and significantly reduce thermal emissivity of glass and glass ceramic substrates. The inventive magnetic recording media can be deposited with thin Cr alloy underlayers and benefit from small grain size. The inventive magnetic recording media exhibit high Hr and high SMNR, and are suitable for high density longitudinal magnetic recording.

The present invention advantageously provides high areal recording density longitudinal magnetic recording media exhibiting reduced grain exchange interaction and, hence, reduce medium noise and high coercivity. The present invention is applicable to the production of various types of magnetic recording media, and is not limited to any particular substrate material, underlayer, magnetic layer, protective overcoat or lubricant topcoat.

Only certain embodiments of the present invention and but a few examples of its versatility are shown and described in the present disclosure. It is to be understood that the present invention is capable of use in various other combinations and in environments, and is capable of changes and modifications within the scope of the inventive concept as expressed herein.

What is claimed is:

1. A magnetic recording medium comprising:
   a non-magnetic substrate;
   a nickel aluminum (NiAl) sub-seedlayer having an oxidized surface on the non-magnetic substrate;
   a NiAl seedlayer on the surface oxidized NiAl sub-seedlayer;
   an underlayer on the NiAl seedlayer; and
   a magnetic layer on the underlayer.

2. The magnetic recording medium according to claim 1, wherein the underlayer comprises chromium or a chromium alloy and the magnetic layer comprises a cobalt alloy containing chromium.

3. The magnetic recording medium according to claim 2, wherein the underlayer comprises a chromium-molybdenum alloy.

4. The magnetic recording medium according to claim 2, wherein the substrate comprises glass or a glass-ceramic material.

5. The magnetic recording medium according to claim 2, further comprising an intermediate cobalt-chromium-tantalum alloy layer between the underlayer and the magnetic layer.

6. The magnetic recording medium according to claim 1, wherein the NiAl sub-seedlayer with the oxidized surface has a thickness of about 50 Å to about 1,000 Å.

7. The magnetic recording medium according to claim 6, wherein the oxidized surface comprises about 10 to about 80 at. % oxygen in a top 50 Å region after in situ sputter removal of a 40 Å surface layer.

8. The magnetic recording medium according to claim 7, wherein the surface of the NiAl sub-seedlayer comprises substantially elemental nickel and aluminum present in the form of about 75 at. % aluminum oxide and about 25 at. % substantially elemental aluminum.

9. The magnetic recording medium according to claim 6, wherein the seedlayer has a thickness of about 1000 Å to about 1,000 Å.

10. A method of manufacturing a magnetic recording medium, the method comprising:
   depositing a nickel aluminum (NiAl) sub-seedlayer on a non-magnetic substrate;
   oxidizing the surface of the NiAl sub-seedlayer;
   depositing a NiAl seedlayer on the surface oxidized NiAl sub-seedlayer; and depositing a magnetic layer on the seedlayer.

11. The method according to claim 10, further comprising depositing an underlayer on the NiAl seedlayer and the magnetic layer on the underlayer.

12. The method according to claim 11, comprising depositing a chromium or chromium-alloy layer as the underlayer and depositing an alloy containing cobalt and chromium as the magnetic layer.

13. The method according to claim 12, comprising depositing a chromium-molybdenum alloy layer as the underlayer.

14. The method according to claim 11, comprising depositing the NiAl sub-seedlayer on a glass or glass-ceramic substrate.

15. The method according to claim 11, comprising oxidizing the surface of the NiAl sub-seedlayer:

- at a temperature of about 20° C. to about 300° C.;
- at a pressure of about 0.1 mTorr to about 200 Torr;
- in an atmosphere comprising about 1 to about 100 vol. % oxygen, the remainder an inert gas;
- for more than about 1 second.

16. The method according to claim 11, comprising oxidizing the surface of the NiAl sub-seedlayer in an atmosphere comprising $SO_2$, $NO_2$, $N_2O$, NO, CO and/or $CO_2$.

17. The method according to claim 15, comprising oxidizing the surface of the NiAl sub-seedlayer such that the oxidized surface comprises about 10 to about 80 at. % oxygen in a top 50 Å region after in situ sputter removal of a 40 Å surface layer.

18. The method according to claim 17, comprising oxidizing the surface of the NiAl sub-seedlayer such the oxidized surface comprises substantially elemental nickel and aluminum present in the form of about 25 at. % substantially elemental aluminum and about 75 at. % aluminum oxide.

19. The method according to claim 12, further comprising depositing an intermediate cobalt-chromium-tantalum layer on the underlayer and the magnetic layer on the intermediate layer.

* * * * *